US012731737B2

(12) United States Patent
Wang et al.

(10) Patent No.: US 12,731,737 B2
(45) Date of Patent: Sep. 8, 2026

(54) PROGRAMMABLE CHALCOGENIDE CAPACITORS

(71) Applicant: Micron Technology, Inc., Boise, ID (US)

(72) Inventors: Hongmei Wang, Boise, ID (US); Huiqi Gong, Redmond, WA (US); Peng Zhao, Boise, ID (US); Jingshan Wang, Eagan, MN (US); Giovanni Ferrari, Boise, ID (US)

(73) Assignee: Micron Technology, Inc, Boise, ID (US)

(*) Notice: Subject to any disclaimer, the term of this patent is extended or adjusted under 35 U.S.C. 154(b) by 1031 days.

(21) Appl. No.: 17/884,450

(22) Filed: Aug. 9, 2022

(65) Prior Publication Data

US 2024/0055190 A1 Feb. 15, 2024

(51) Int. Cl.
*H01G 7/06* (2006.01)
*G11C 13/00* (2006.01)

(52) U.S. Cl.
CPC .......... *H01G 7/06* (2013.01); *G11C 13/0038* (2013.01)

(58) Field of Classification Search
CPC .................................................. G11C 13/0038
See application file for complete search history.

(56) References Cited

U.S. PATENT DOCUMENTS

2021/0090652 A1* 3/2021 Arendt ............... G11C 13/0038

* cited by examiner

*Primary Examiner* — Jason Lappas
(74) *Attorney, Agent, or Firm* — Holland & Hart LLP

(57) ABSTRACT

Methods, systems, and devices for programmable chalcogenide capacitors are described. A first programming pulse may be applied, for a first duration, to a capacitor comprising a chalcogenide material to adjust a capacitance of the capacitor from a first capacitance to a second capacitance. A pulse may be applied to the capacitor based on applying the first programming pulse to the capacitor. A first voltage may be stored in the capacitor based on adjusting the capacitance of the capacitor from the first capacitance to the second capacitance, and the first voltage may be stored based on the capacitor having the second capacitance.

25 Claims, 4 Drawing Sheets

100

Apply, for a first duration, a first programming pulse to a capacitor comprising a chalcogenide material to adjust a capacitance of the capacitor from a first capacitance to a second capacitance

405

Store a first voltage to the capacitor based at least in part on adjusting the capacitance of the capacitor from the first capacitance to the second capacitance, wherein the first voltage is based at least in part on the capacitor having the second capacitance

410

FIG. 4

PROGRAMMABLE CHALCOGENIDE CAPACITORS

FIELD OF TECHNOLOGY

The following relates to programmable chalcogenide capacitors.

BACKGROUND

Capacitors are widely deployed as energy storage components in electronic devices. For example, an electronic device may include multiple capacitors, which may store one or more voltages. In some cases, a capacitor may include a dielectric material between two conductive materials. For example, a capacitor may include a first conductor, which may be referred to as an anode, and a second conductor, which may be referred to as a cathode. A capacitor may have a capacitance, which may indicate an ability of the capacitor to store a voltage. In some cases, a capacitance of a capacitor may be based on one or more properties of the first conductor, the second conductor, the dielectric material, or any combination thereof. For example, a capacitance of a capacitor may be based on a distance between the first conductor and the second conductor, an electrical property of the dielectric material, or both.

Various types of capacitors exist, including ceramic capacitors, film capacitors, power film capacitors, electrolytic capacitors, supercapacitors, class X capacitors, class Y capacitors, and others. Capacitors may be manufactured using various materials and in various sizes. Capacitors are widely used within electrical circuits and generally include at least two electrical conductors, which may be referred to as plates, separated by an insulating layer, which may be referred to as a dielectric layer. In some cases, a capacitor may be categorized as a passive electrical component. In some applications, capacitors may be used for energy storage, power conditioning, signal processing, sensing, storing data, and other uses.

BRIEF DESCRIPTION OF THE DRAWINGS

FIG. 4 illustrates an example of a flowchart illustrating a method or methods that support programmable chalcogenide capacitors in accordance with examples as disclosed herein.

DETAILED DESCRIPTION

A capacitor may be manufactured to meet a capacitance specification and thus may be intended to operate at a specified (e.g., a fixed) capacitance. However, in some applications, it may be desirable to dynamically configure (e.g., program) a capacitance of a capacitor. In such cases, a complementary metal-oxide-semiconductor (CMOS) programmable capacitor array may be used instead of a single capacitor with a fixed capacitance. The CMOS programmable capacitor array may include multiple capacitors wired in parallel, where each capacitor is coupled with a respective switching component (e.g., a respective CMOS transistor). By enabling or disabling individual capacitors of the array (e.g., via the respective switching components), a capacitance of the array (e.g., a combined capacitance of each capacitor of the array) may be configured dynamically. However, a CMOS programmable capacitor array may increase complexity, size, and cost of an electronic device due to a quantity of capacitors and switching components included in the array. Additionally or alternatively, a structure for a CMOS programmable capacitor array may be limited to two-dimensions (2D) and may be difficult to scale due to size limitations for a footprint of a device that includes the array.

In accordance with examples as disclosed herein, a chalcogenide material may be utilized as a dielectric material for a capacitor, which may enable a capacitance of an individual chalcogenide capacitor to be configured dynamically. For example, a chalcogenide capacitor may include a first conductive material, a second conductive material, and a chalcogenide material between the first conductive material and the second conductive material. A programming pulse (e.g., an electrical pulse) may be applied to the chalcogenide capacitor, which may change a physical property of the chalcogenide material (e.g., increasing or decreasing a crystallinity of the chalcogenide material) thereby adjusting a capacitance of the chalcogenide capacitor. For example, applying a programming pulse to the chalcogenide capacitor may change an atomic structure of the chalcogenide material to be more or less crystalline (or more or less amorphous). In some cases, multiple chalcogenide capacitors may be arranged in a three-dimensional (3D) array, which may have a smaller footprint than a CMOS programmable capacitor array. Additionally or alternatively, a chalcogenide capacitor array may not include CMOS transistors, which my reduce fabrication costs of the array and prevent faults in the electronic device that may otherwise occur due to the presence of the CMOS transistors.

Features of the disclosure are initially described in the context of circuits and a block diagram as described with reference to FIGS. 1-2B. These and other features of the disclosure are further illustrated by a process flow diagram and flowchart that relate to programmable chalcogenide capacitors as described with references to FIGS. 3 and 4.

Figure 1:
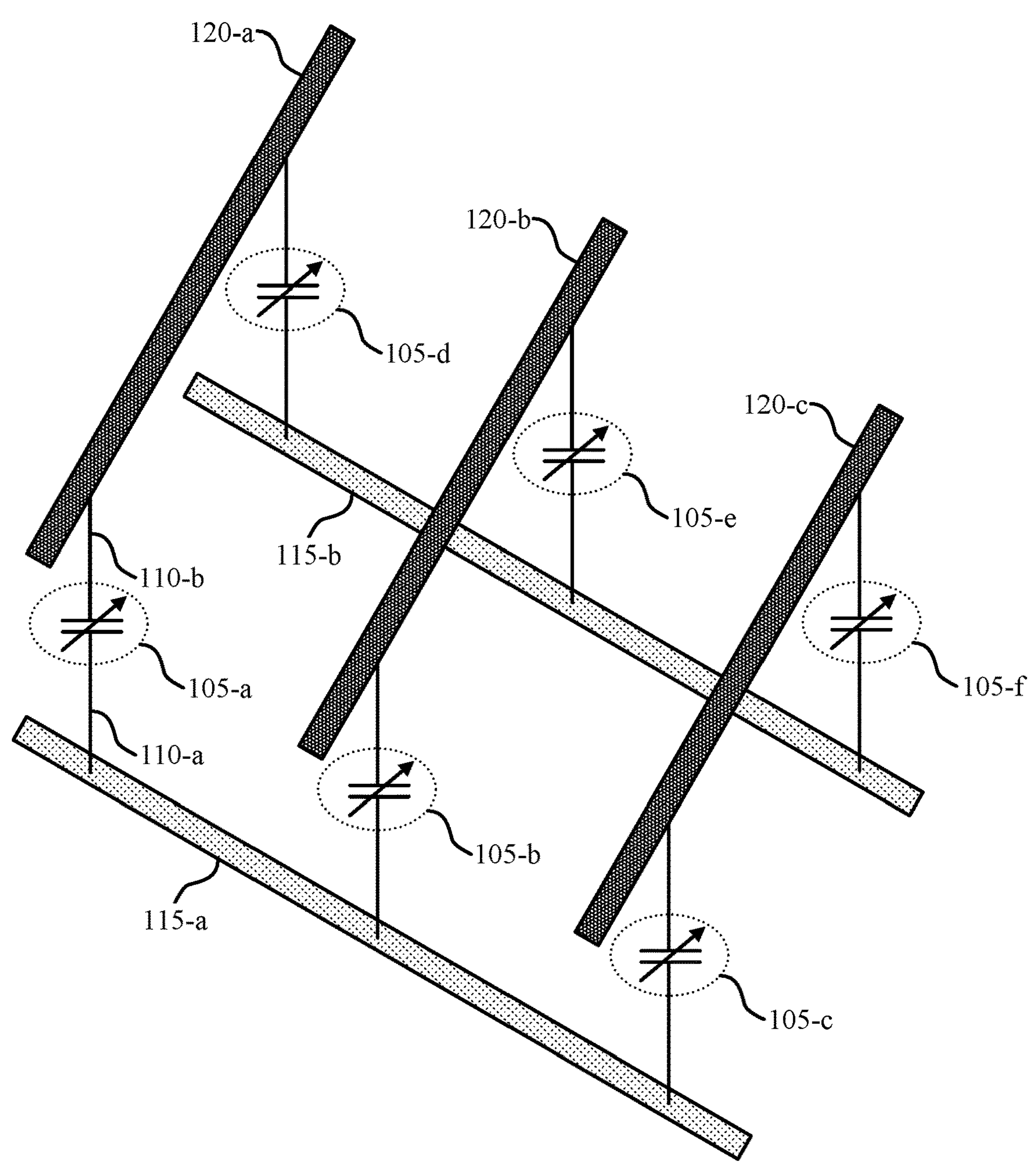
FIG. 1 illustrates an example of a circuit that supports programmable chalcogenide capacitors in accordance with examples as disclosed herein.

FIG. 1 illustrates an example of a circuit 100 that supports programmable chalcogenide capacitors in accordance with examples as disclosed herein. The circuit 100 may include multiple chalcogenide capacitors 105 (e.g., chalcogenide capacitors 105-*a*, 105-*b*, 105-*c*, 105-*d*, 105-*e*, 105-*f*), which may each be electronically coupled with one or more conductive lines 110. For example, the chalcogenide capacitor 105-*a* may be electronically coupled with a conductive line 110-*a* and a conductive line 110-*b*. In other examples, the capacitors 105 may be coupled with one or more electrodes (not shown). Additionally or alternatively, the circuit 100 may include anodes 120 and cathodes 115. Each chalcogenide capacitor 105 included in the circuit 100 may be coupled with a respective anode 120 (e.g., directly, via a conductive line 110-*a*, or via one or more electrodes (not shown)) and with a respective cathode 115 (e.g., directly, via a conductive line 110-*b*, or via one or more electrodes (not shown)). In some examples, the chalcogenide capacitors 105 may refer to a chalcogenide material positioned between an anode and a cathode or between two electrodes.

The circuit 100 may be an example of an array of chalcogenide capacitors 105 (e.g., a 3D cross-point array of capacitors 105). Although FIG. 1 shows an example of an array including multiple chalcogenide capacitors 105, it should be understood that the aspects of the present disclosure, as described herein, may be applied to an array including any quantity of chalcogenide capacitors 105. That is, in some cases, the circuit 100 may include one chalcogenide capacitor 105. Additionally or alternatively, any chalcogenide capacitor 105 described with reference to FIG. 1 may function independently (e.g., may operation without being electronically coupled to one or more chalcogenide capacitors 105).

To program a chalcogenide capacitor 105, a programming pulse (e.g., a current) may be applied to the chalcogenide capacitor 105 via an anode 120, a cathode 115, or both. An anode 120 may be an example of a conductive material coupled with a chalcogenide capacitor 105 (e.g., coupled with a positive terminal of a chalcogenide capacitor 105). In some cases, the anode 120 may be coupled directly with the chalcogenide capacitor 105. In some other cases, the anode 120 may be coupled with the chalcogenide capacitor 105 via a conductive line 110-*b*. The anode 120 may be an example of a plate, a line, or any conductor formed in any other geometric shape, which may be coupled with one or more chalcogenide capacitors 105.

A cathode 115 may be an example of a conductive material coupled with a chalcogenide capacitor 105 (e.g., coupled with a negative terminal of a chalcogenide capacitor 105). In some cases, the cathode 115 may be coupled directly with the chalcogenide capacitor 105. In some other cases, the cathode 115 may be coupled with the chalcogenide capacitor 105 via a conductive line 110-*a*. The cathode 115 may be an example of a plate, a line, or any conductor formed in any other geometric shape, which may be coupled with one or more chalcogenide capacitors 105. In some cases, an anode 120 may be referred to as a source (e.g., a terminal which current may flow into) and a cathode 115 may be referred to as a drain (e.g., a terminal which current may flow out of).

The circuit 100 may include a controller (not shown), which may be electronically coupled with any combination of anodes 120 and cathodes 115. The controller may be coupled with or configured to activate one or more voltage sources, which may apply a respective voltage to any combination of anodes 120 and cathodes 115. In some cases, the controller may selectively apply a voltage to any combination of an anode 120-*a*, an anode 120-*b*, an anode 120-*c*, a cathode 115-*a*, and a cathode 115-*b*, which may result in a programming pulse being applied across one or more capacitors 150. Applying a programming pulse may include applying a voltage (e.g., greater than a first threshold voltage) to an anode 120, a cathode 115, or both, in a time-controlled manner. In some cases, the controller may apply a programming pulse to multiple anodes 120, cathodes 115, or both, concurrently.

The controller may be coupled with and communicate with one or more chalcogenide capacitors 105. The controller may cause the one or more chalcogenide capacitors 105 to perform various operations in accordance with examples as described herein. In some cases, the controller may receive commands from an electronic device and communicate with the one or more chalcogenide capacitors 105 to execute such commands. For example, the controller may receive commands or operations from an electronic device and may convert the commands or operations into instructions or appropriate commands to achieve the desired outcome at the one or more chalcogenide capacitors 105.

In some cases, the controller may exchange data with an electronic device and the one or more chalcogenide capacitors 105 (e.g., in response to or otherwise in association with commands from the electronic device). For example, the controller may convert responses (e.g., signals) associated with the one or more chalcogenide capacitors 105 into corresponding signals for the electronic device. The controller may include hardware such as one or more integrated circuits or discrete components, a buffer memory, or a combination thereof. The hardware may include circuitry with dedicated (e.g., hard-coded) logic to perform the operations ascribed herein to the controller. The controller may be or include a microcontroller, special purpose logic circuitry (e.g., a field programmable gate array (FPGA), an application specific integrated circuit (ASIC), a digital signal processor (DSP)), or any other suitable processor or processing circuitry.

The circuit 100 may include any quantity of non-transitory computer readable media that support programmable chalcogenide capacitors. For example, the controller and the one or more chalcogenide capacitors 105 may include or otherwise may access one or more non-transitory computer readable media storing instructions (e.g., firmware, logic, code) for performing the functions ascribed herein to the one or more chalcogenide capacitors 105 or the controller. For example, such instructions, if executed by the controller may cause the controller to perform associated functions as described herein.

Applying a programming pulse to a chalcogenide capacitor 105 may adjust a capacitance of the chalcogenide capacitor 105 if a voltage of the programming pulse is greater than a first threshold voltage of a chalcogenide capacitor 105. Additionally or alternatively, if a pulse applied to the chalcogenide capacitor 105 is below the first threshold voltage, the chalcogenide capacitor 105 may store a voltage associated with the pulse (e.g., the capacitor may store a charge based on the pulse being applied to the capacitor 105). For example, the first threshold voltage may correspond to a transition point of the chalcogenide material associated with the chalcogenide capacitor 105 at which voltages exceeding the first threshold voltage are not stored in the chalcogenide capacitor 105, but rather adjust a physical property of the chalcogenide material. As described herein, the phrase "programming pulse" may refer to a pulse with a voltage greater than the first threshold voltage that is used to adjust a capacitance of a capacitor 105, and a "pulse" may refer to a pulse with a voltage less than the first threshold voltage used to store a voltage (e.g., a charge based on the pulse being applied) to a capacitor 105. An absolute value of the voltage level of the programming pulse may be greater than voltages experienced by the chalcogenide capacitor 105 during normal operation of the circuit associated with the chalcogenide capacitor 105.

In some cases, a pulse may be applied to a chalcogenide capacitor 105 to store a voltage (e.g., a charge based on the pulse being applied) in the chalcogenide capacitor 105. The stored voltage may be based on a capacitance of the chalcogenide capacitor 105. In some cases, a controller may determine to store a voltage in a chalcogenide capacitor 105 for one or more operations of a device or system that includes that chalcogenide capacitor 105. For example, an analog to digital converter may include one or more chalcogenide capacitors 105. A controller for the analog to digital converter may store a voltage in the one or more chalcogenide capacitors 105 included in the analog to digital converter. Accordingly, the analog to digital converter may perform one or more operations utilizing the voltage stored in the one or more chalcogenide capacitors 105. In some cases, one or more voltages stored in a chalcogenide capacitor 105 may be utilized for energy storage operations, power conditioning operations, signal processing operations, sensing operations, data storage operations, or other uses.

Programming a capacitance of a chalcogenide capacitor 105 may be based on the first threshold voltage and a second threshold voltage. The first threshold voltage may correspond to a first transition point, where applying a programming pulse with a voltage greater than the first threshold voltage increases the capacitance of the chalcogenide capacitor 105. Additionally or alternatively, the second threshold voltage may correspond to a second transition point, where applying a programming pulse with a voltage greater than the second threshold voltage decreases the capacitance of the chalcogenide capacitor 105. For example, a controller may activate one or more voltage sources to apply a programming pulse with a voltage above the second threshold voltage to a chalcogenide capacitor 105, and a capacitance of the chalcogenide capacitor 105 may decrease or may be reset to an initial value. In some cases, the second threshold voltage may be greater than the first threshold voltage.

Additionally or alternatively, a capacitance of a chalcogenide capacitor 105 may be decreased by applying electromagnetic radiation to the chalcogenide capacitor 105. For example, heat, ultraviolet (UV) light, or any other form of electromagnetic radiation may be applied to the chalcogenide capacitor 105 and may reduce a capacitance of the chalcogenide capacitor 105. Applying electromagnetic radiation to the chalcogenide capacitor 105 may reduce a capacitance of the chalcogenide capacitor 105 if a quantity of the electromagnetic radiation is greater than a threshold quantity. In some cases, applying electromagnetic radiation to a chalcogenide capacitor 105 may reset a capacitance of the chalcogenide capacitor 105 to an initial capacitance.

In some cases, a controller may initiate the application of electromagnetic radiation to the chalcogenide capacitor 105. Additionally or alternatively, any other device capable of producing electromagnetic radiation may be used to apply electromagnetic radiation to one or more chalcogenide capacitors 105. As an illustrative example, a chalcogenide capacitor 105 or an electronic device including one or more chalcogenide capacitors 105 may be returned to a manufacturer for troubleshooting or failure analysis. As part of a troubleshooting or failure analysis process, electromagnetic radiation may be applied to one or more chalcogenide capacitors 105 to reset a capacitance of the one or more chalcogenide capacitors 105 to an initial value.

In some cases, a capacitance of a chalcogenide capacitor 105 may be based on a duration of a programming pulse. For example, applying a programming pulse with a relatively long duration may increase a capacitance of a chalcogenide capacitor 105 to a value that is relatively higher than when applying a programming pulse with a relatively short duration. Additionally or alternatively, if a programming pulse is above the second threshold voltage, applying the programming pulse for a relatively long duration may decrease the capacitance of the chalcogenide capacitor 105 to a value that is relatively higher than when applying a programming pulse with a relatively short duration. In some cases, a controller may determine a duration for a programming pulse applied to a chalcogenide capacitor 105 based on a desired capacitance of the chalcogenide capacitor 105. The controller may determine the desired capacitance based on one or more parameters associated with a system or device that includes the chalcogenide capacitor 105. The controller may then apply the programming pulse, with the determined duration, to the chalcogenide capacitor 105.

In some cases, a programming pulse may be applied with a certain polarity. For example, a programming pulse may be applied to a chalcogenide capacitor 105 with a positive polarity or a negative polarity. In some cases, applying a programming pulse with a positive polarity may include applying the programming pulse to a chalcogenide capacitor 105 via an anode 120 such that the anode 120 has a higher electrical potential than a corresponding cathode 115. For example, applying the programming pulse to the anode 120 may develop a first charge on a first conductive material of the chalcogenide capacitor 105, which may be greater than a second charged developed on a second conductive material of the chalcogenide capacitor 105. In some cases, applying a programming pulse with a negative polarity may include applying a programming pulse to the chalcogenide capacitor 105 via a cathode 115 such that the cathode 115 has a higher electrical potential than a corresponding anode 120. Applying the programming pulse to the cathode 115 may develop a third charge on the second conductive material of the chalcogenide capacitor 105, which may be greater than a fourth charge developed on the first conductive material of the chalcogenide capacitor 105.

In some cases, applying a programming pulse to a chalcogenide capacitor 105 may adjust (e.g., increase, decrease, change) a capacitance of the chalcogenide capacitor 105 regardless of a polarity of the programming pulse. For example, applying a programming pulse with a positive polarity to a chalcogenide capacitor 105 may increase a capacitance of the chalcogenide capacitor 105. Similarly, applying a programming pulse with a negative polarity to the chalcogenide capacitor 105 may also increase the capacitance of the chalcogenide capacitor 105. That is, a capacitance of a chalcogenide capacitor 105 may be agnostic (e.g., may not depend on) a polarity of a programming pulse.

In some other cases, applying a programming pulse to a chalcogenide capacitor 105 may adjust (e.g., increase, decrease, change) a capacitance of the chalcogenide capacitor 105 based on a polarity of the programming pulse. For example, applying a programming pulse with a positive polarity to a chalcogenide capacitor 105 may increase a capacitance of the chalcogenide capacitor 105 and applying a programming pulse with a negative polarity to a chalcogenide capacitor 105 may decrease the capacitance of the chalcogenide capacitor 105. That is, a capacitance of the chalcogenide capacitor 105 may be adjusted according to a polarity of one or more programming pulses. In some cases, a chalcogenide capacitor 105 may exhibit non-linear behavior in response to a programming pulse. For example, applying a programming pulse with a positive polarity or a negative polarity to the chalcogenide capacitor 105 may increase a capacitance of the chalcogenide capacitor 105 over a first duration during which the programming pulse is applied and may decrease a capacitance of the chalcogenide capacitor 105 over a second duration during which the programming pulse is applied, or vice versa.

A capacitance of a chalcogenide capacitor 105 may be programmed (e.g., adjusted) one or more times. For example, a controller may apply (or initiate applying via one or more voltage sources), for a first duration, a first programming pulse to a chalcogenide capacitor 105 to adjust the capacitance of the chalcogenide capacitor 105 from a first capacitance to a second capacitance. The first programming pulse may have a voltage greater than the first threshold voltage and less than the second threshold voltage. Accordingly, the second capacitance may be greater than the first capacitance (e.g., the capacitance of the capacitor 105 may be increased).

In some cases, the controller may apply, for a second duration, a second programming pulse to the chalcogenide capacitor 105 to adjust the capacitance of the chalcogenide capacitor 105 from the second capacitance to a third capacitance. The second programming pulse may also have a voltage greater than the first threshold voltage and less than the second threshold voltage. Accordingly, the third capacitance may be greater than the second capacitance. In some cases, the controller may determine to increase a capacitance of the chalcogenide capacitor 105 one or more times based on one or more parameters associated with a system or device that includes the chalcogenide capacitor 105.

Any quantity of programming pulses may be applied to a chalcogenide capacitor 105 to program the chalcogenide capacitor 105 to a desired capacitance. For example, two or more programming pulses with relatively short durations may be used to program a same capacitance as one programming pulse with a relatively long duration. Additionally or alternatively, programming a chalcogenide capacitor 105 may include applying programming pulses with any combination of voltages. For example, a controller may apply, for a first duration, a first programming pulse with a first voltage above the second threshold voltage to a chalcogenide capacitor 105. Applying the first programming pulse may initialize a capacitance of the chalcogenide capacitor 105. That is, applying the first programming pulse may reset the capacitance of the chalcogenide capacitor 105 to an initial value. The controller may then apply, for a second duration, a second programming pulse with a second voltage below the second threshold voltage and above the first threshold voltage to the chalcogenide capacitor 105. Applying the second programming pulse may increase the capacitance of the chalcogenide capacitor 105 from the initial value to a desired value.

In some cases, multiple chalcogenide capacitors 105 may be programmed in parallel or in series. For example, a controller may concurrently apply a programming pulse to the anode 120-*a* and the anode 120-*b*, which may adjust a capacitance of the chalcogenide capacitor 105-*a*, the chalcogenide capacitor 105-*b*, the chalcogenide capacitor 105-*d*, and the chalcogenide capacitor 105-*e*. Concurrently applying the programming pulse to the anode 120-*a* and the anode 120-*b* may program the chalcogenide capacitor 105-*a* and the chalcogenide capacitor 105-*d* in parallel with the chalcogenide capacitor 105-*b* and the chalcogenide capacitor 105-*e*. Additionally or alternatively, multiple chalcogenide capacitors 105 may be programmed in parallel using different programming pulses. For example, a controller may concurrently apply a first programming pulse to the anode 120-*a* and a second programming pulse to the anode 120-*b*. Accordingly, a capacitance of the chalcogenide capacitor 105-*a* and a capacitance of the chalcogenide capacitor 105-*d* may be programmed to a first capacitance. A capacitance of the chalcogenide capacitor 105-*b* and the chalcogenide capacitor 105-*e* may be programmed to a second capacitance different from the first capacitance.

A capacitance of a chalcogenide capacitor 105 may be based on a programming pulse applied to an anode 120, a cathode 115, or both. For example, a controller may apply (or may initiate applying) a first programming pulse to the anode 120-*a*, a second programming pulse to the cathode 115-*a*, and a third programming pulse to the cathode 115-*b*. The first programming pulse, the second programming pulse, and the third programming pulse may be applied concurrently. Based on applying the first programming pulse and the second programming pulse, a first capacitance may be programmed at the chalcogenide capacitor 105-*a*. Based on applying the first programming pulse and the third programming pulse, a second capacitance may be programmed at the chalcogenide capacitor 105-*d*. In some cases, if the second programming pulse and the third programming pulse have a same voltage, the first capacitance and the second capacitance may have a same value. In some other cases, if the second programming pulse and the third programming pulse have different voltages, the first capacitance and the second capacitance may have different values.

The circuit 100 may be an example of a 3D array of chalcogenide capacitors 105. The 3D array of chalcogenide capacitors 105 may include two or more 2D arrays of chalcogenide capacitors 105, which may be stacked on top of one another or positioned next to one another (e.g., relative to a substrate). In some examples, 2D arrays of chalcogenide capacitors 105 in the circuit 100 may be referred to as decks, levels, and layers. A 3D array of chalcogenide capacitors 105 may include any quantity of stacked 2D arrays of chalcogenide capacitors 105 (e.g., two high, three high, etc.).

The architecture of the circuit 100 (e.g., the 3D array of chalcogenide capacitors 105) may be referred to as a cross-point architecture, in some examples, in which a chalcogenide capacitor 105 is formed at a topological cross-point between an anode 120 and a cathode 115. Such a cross-point architecture may increase a density of a circuit 100 while production costs may be low when compared to other architectures for capacitor arrays (e.g., 2D CMOS programmable capacitor arrays). For example, the cross-point architecture may include chalcogenide capacitors 105 with a reduced area and, resultantly, an increased density compared to other architectures. The cross-point architecture may additionally reduce or eliminate a quantity of transistors (e.g., CMOS transistors), which may have three-terminals, and may be relatively large when compared to the cross-point architecture.

Figure 2A:
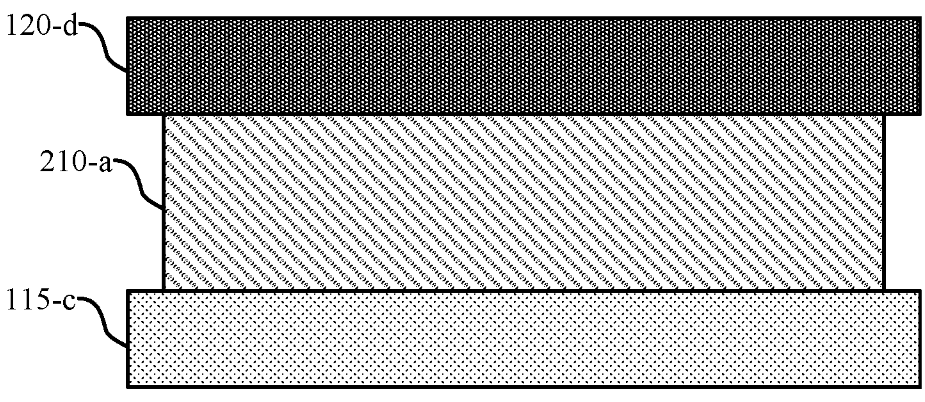
FIG. 2A illustrates an example of a block diagram that supports programmable chalcogenide capacitors in accordance with examples as disclosed herein.
Figure 2A:
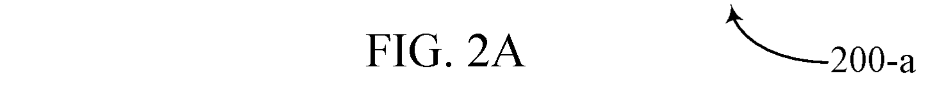

FIG. 2A illustrates an example of a diagram 200-*a* that supports programmable chalcogenide capacitors in accordance with examples as disclosed herein. One or more aspects of the diagram 200-*a* may be implemented by one or more aspects of the circuit 100, as described with reference to FIG. 1. For example, the diagram 200-*a* may include an anode 120-*d* and a cathode 115-*c*, which may be examples of anodes 120 and cathodes 115 as described with reference to FIG. 1. Additionally or alternatively, the diagram 200-*a* may include a chalcogenide material 210-*a*, which may be an example of a material included in a chalcogenide capacitor 105, as described with reference to FIG. 1. Although not shown in FIG. 2A, it may be understood that the chalcogenide material 210-*a* may be electronically coupled with the anode 120-*d* and the cathode 115-*c* via respective conductive lines 110, as described with reference to FIG. 1.

As described herein, the diagram 200-*a* may be an example of a side view of a chalcogenide capacitor 105, as described with reference to FIG. 1. Although described as separate components with reference to the array configuration shown in FIG. 1, a chalcogenide capacitor 105 (e.g., when not included in an array of multiple chalcogenide capacitors 105) may include an anode 120-*d* and a cathode 115-*c*. The anode 120-*d* and the cathode 115-*c* may be examples of conductive materials. For example, the anode 120-*d* and the cathode 115-*c* may be metallic plates. In some cases, the anode 120-*d* and the cathode 115-*c* may be a same conductive material. In some cases, the anode 120-*d* may be a first conductive material and the cathode 115-*c* may be a second conductive material different from the first conductive material.

In some cases, the anode 120-*d* may be coupled directly with the chalcogenide material 210-*a*. In some other cases, the anode 120-*d* may be coupled with the chalcogenide material 210-*a* via a conductive line 110-*b*, as described with reference to FIG. 1. The anode 120-*d* may be an example of a plate, a line, or any conductor formed in any other geometric shape, which may be coupled with one or more chalcogenide materials 210-*a*. In some cases, the cathode 115-*c* may be coupled directly with the chalcogenide material 210-*a*. In some other cases, the cathode 115-*c* may be coupled with the chalcogenide material 210-*a* via a conductive line 110-*a*. The cathode 115-*c* may be an example of a plate, a line, or any conductor formed in any other geometric shape, which may be coupled with one or more chalcogenide materials 210-*a*. In some cases, an anode 120-*d* may be referred to as a source (e.g., a terminal which current may flow into) and a cathode 115-*c* may be referred to as a drain (e.g., a terminal which current may flow out op.

In some cases, a programming pulse may be applied to the anode 120-*d*, which may cause a charge to accumulate on the anode 120-*d*. As a result of the charge accumulating on the anode 120-*d*, an electrical potential of the anode 120-*d* may be greater than an electrical potential of the cathode 115-*c*. In some cases, a chalcogenide capacitor 105 may store a voltage based on a difference between an electrical potential of the anode 120-*d* and the electrical potential of the cathode 115-*c*. Additionally or alternatively, the voltage (e.g., the electrical potential) may be based on a property of the chalcogenide material 210-*a*, which may be configured by applying the programming pulse to the chalcogenide capacitor 105 (e.g., to the anode 120-*d*, to the cathode 115-*c*, or both).

The chalcogenide material 210-*a* may be an alloy including selenium (Se), tellurium (Te), arsenic (As), antimony (Sb), carbon (C), germanium (Ge), silicon (Si), sulfur (S), or indium (IN), or various combinations thereof. In some examples, chalcogenide material 210-*a* may be an example of a phase change material. The chalcogenide material 210-*a* may be operated so as to undergo a phase change or a change to a different physical state during operation of a chalcogenide capacitor 105. For example, the chalcogenide material 210-*a* may have an amorphous state (e.g., a relatively disordered atomic configuration) and a crystalline state (e.g., a relatively ordered atomic configuration). In some other cases, the chalcogenide material 210-*a* may be operated such that one or more properties (e.g., electrical properties) of the chalcogenide material 210-*a* may change without the chalcogenide material 210-*a* undergoing a phase change. For example, a controller may apply a programming pulse to the chalcogenide material 210-*a*, which may change a capacitance of the chalcogenide material 210-*a* without changing a phase of the chalcogenide material 210-*a*. For example, a capacitance of the chalcogenide material 210-*a* may change (e.g., increase, decrease) without the chalcogenide material 210-*a* changing from an amorphous state or a crystalline state or vice versa.

In some cases, a capacitance of a chalcogenide capacitor 105 may be based on a state of the chalcogenide material 210-*a*. For example, a relatively amorphous state may correspond to a relatively low capacitance and a relatively crystalline state may correspond to a relatively high capacitance. During a programming operation for a chalcogenide capacitor 105, a controller may apply a programming pulse to the chalcogenide material 210-*a* and a voltage of the programming pulse may influence (e.g., determine, set, program) a particular behavior or characteristic of the chalcogenide material 210-*a*, such as the state of the chalcogenide material 210-*a*. To program the chalcogenide material 210-*a* with a relatively high capacitance, a programming pulse with a voltage above a first threshold voltage and below a second threshold voltage may be applied. To program the chalcogenide material 210-*a* with a relatively low capacitance, a programming pulse with a voltage above the second threshold voltage may be applied, which may heat or melt the chalcogenide material 210-*a* to form, at least temporarily, a relatively disordered (e.g., amorphous) atomic arrangement.

Figure 2B:
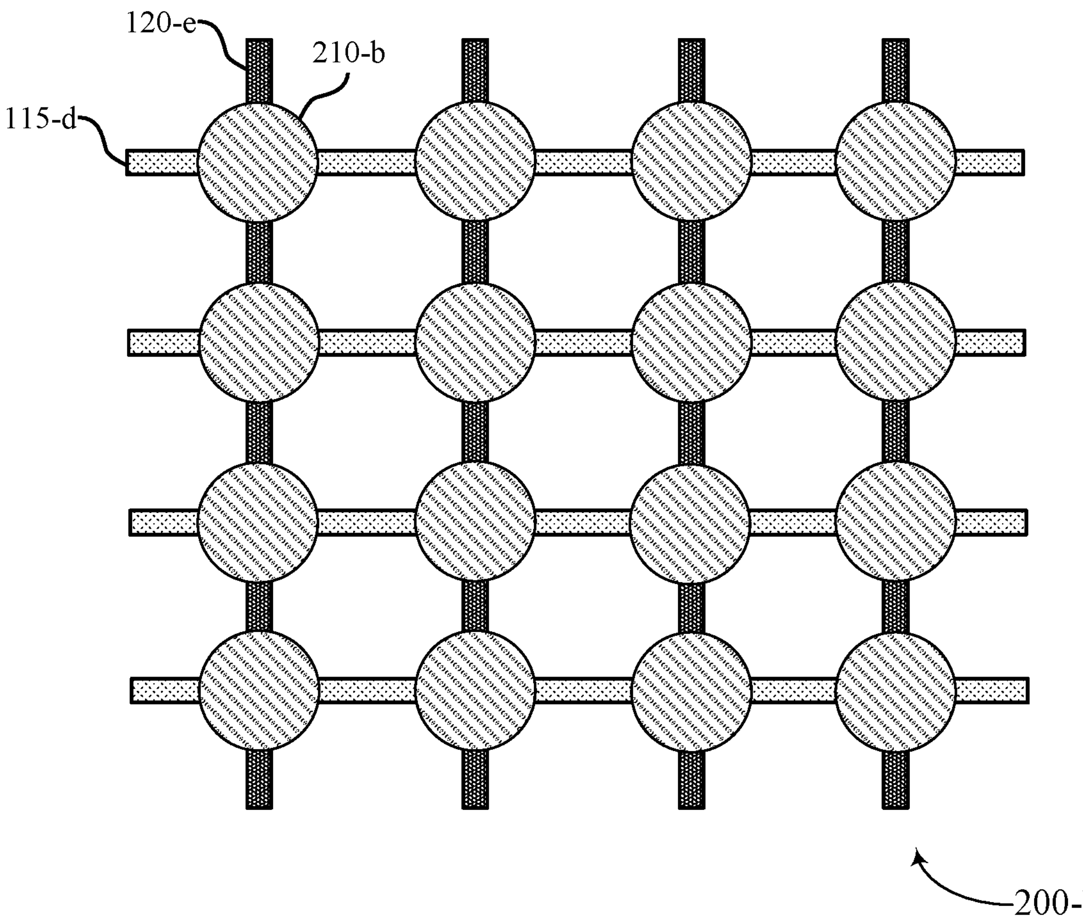
FIG. 2B illustrates an example of a circuit that supports programmable chalcogenide capacitors in accordance with examples as disclosed herein.

FIG. 2B illustrates an example of a circuit 200-*b* that supports programmable chalcogenide capacitors in accordance with examples as disclosed herein. One or more aspects of the circuit 200-*b* may be implemented by one or more aspects of the circuit 100, as described with reference to FIG. 1 and by one or more aspects of the diagram 200-*a*, as described with reference to FIG. 2A. For example, the circuit 200-*b* may include multiple anodes 120-*e*, arranged in parallel, with may be examples of anodes 120 as described with reference to FIGS. 1 and 2A. Similarly, the circuit 200-*b* may include multiple cathodes 115-*d*, arranged in parallel, which may be examples of cathodes 115-*c* as described with reference to FIGS. 1 and 2A. Additionally or alternatively, the circuit 200-*b* may include multiple chalcogenide materials 210-*b*, arranged in a matrix, which may be examples of the chalcogenide material 210-*a*, as described with reference to FIG. 2A.

The circuit 200-*b* may include one or more aspects of an array of chalcogenide capacitors 105. For example, the circuit 200-*b* may include multiple columns of anodes 120-*d* and multiple rows of cathodes 115-*d*, which may be coupled with respective chalcogenide materials 210-*b*. Each chalcogenide material 210-*b* may be included in a respective chalcogenide capacitor 105, as described with reference to FIG. 1. The circuit 200-*b* may be utilized to enable programming of chalcogenide capacitors 105. For example, a controller may apply a programming pulse to any combination of anodes 120-*e*, and cathodes 115-*d*, which may adjust a capacitance of respective chalcogenide materials 210-*b* (e.g., respective chalcogenide capacitors 105).

Although FIG. 2B shows an example of a 2D configuration for an array of chalcogenide materials 210-*b*, it should be understood that chalcogenide materials 210-*b* may also be configured in a 3D array. For example, the circuit 200-*b* may represent a single layer of a 3D array of chalcogenide materials 210-*b*. For example, a chalcogenide material 210-*b* may be coupled with an anode 120-*e* and a cathode (not shown) included in a second layer of a 3D array (not shown). In some cases, the circuit 200-*b* may also include access lines 110 (not shown), which may be examples of access lines as described with reference to FIG. 1.

Figure 3:
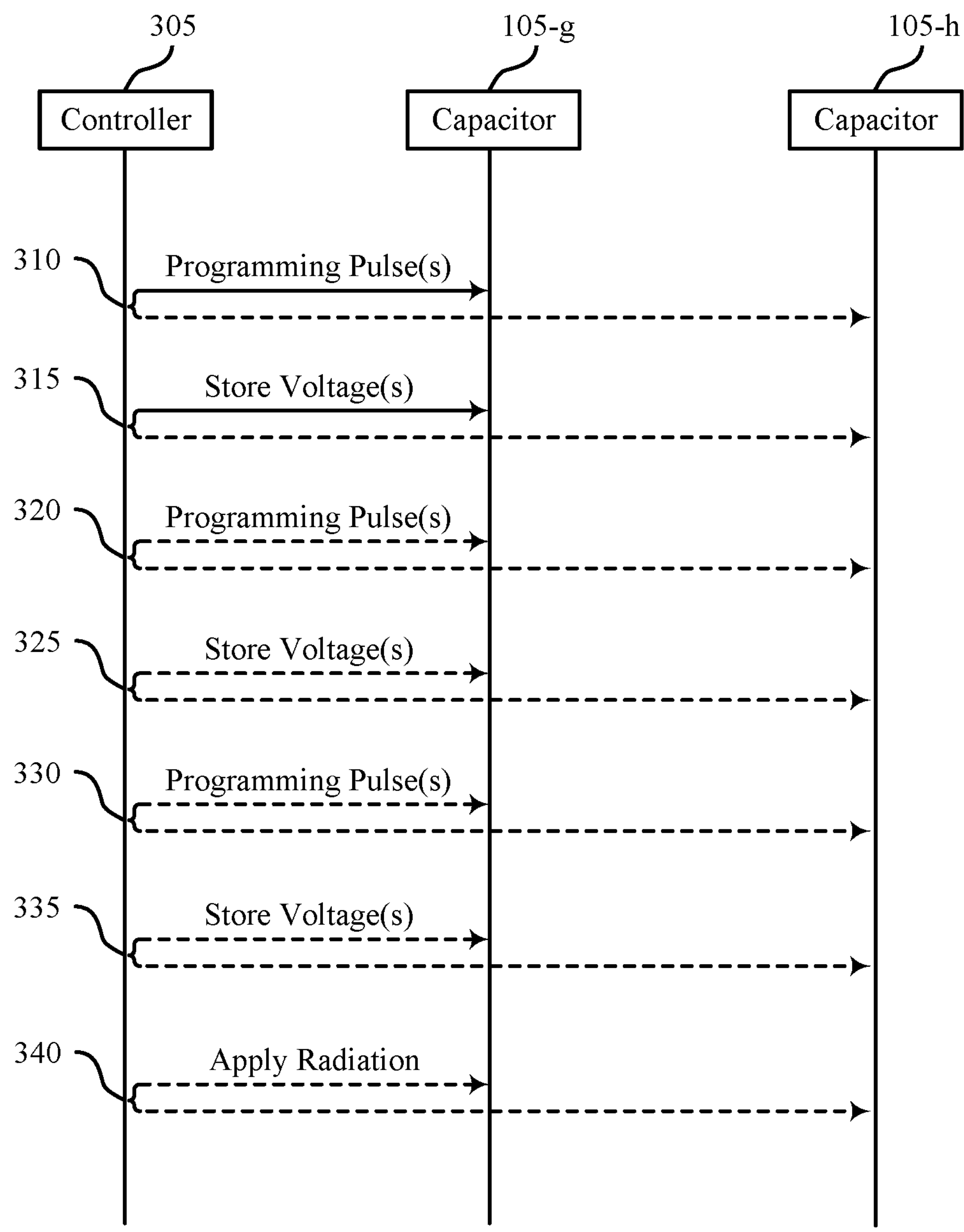
FIG. 3 illustrates an example of a process flow diagram that supports programmable chalcogenide capacitors in accordance with examples as disclosed herein.

FIG. 3 illustrates an example of a process flow diagram 300 that supports programmable chalcogenide capacitors in accordance with examples as disclosed herein. One or more aspects of the process flow diagram 300 may be implemented by one or more aspects of the circuit 100, the diagram 200-*a*, and the circuit 200-*b*, as described with reference to FIGS. 1-2B. For example, the process flow diagram 300 may include a chalcogenide capacitor 105-*g*, and a chalcogenide capacitor 105-*h*, which may be examples of the chalcogenide capacitors 105, as described with reference to FIG. 1. The process flow diagram 300 may also include a controller 305.

In the following description of process flow diagram 300, the operations between the controller 305, the chalcogenide capacitor 105-*g*, and the chalcogenide capacitor 105-*h* may be performed in a different order than the order shown, or the operations may be performed at different times. Some operations may also be left out of the process flow diagram 300, or other operations may be added to the process flow diagram 300. While the controller 305 is shown performing a number of the operations of the process flow diagram 300, any device may perform the operations shown. In some cases, the controller 305 may determine to apply a programming pulse to or store a voltage in one or more chalcogenide capacitors 105 based on one or more parameters associated with a system or device that includes the one or more chalcogenide capacitors 105.

The controller 305 may include circuits, logic, or components operable to perform the operations described in the process flow diagram 300. The controller 305 may include the hardware, the firmware, or the instructions that enable the controller 305 to perform various operations and may be operable to receive, transmit, or execute commands, data, or control information related to the controller 305. The controller 305 may be operable to communicate with (e.g., program) one or more of the chalcogenide capacitors 105. In some examples, the controller 305 may control operation of the chalcogenide capacitors 105 as described herein. Examples of components that may be included in the controller 305 may include receivers for receiving signals, transmitters for transmitting signals, decoders for decoding or demodulating received signals, encoders for encoding or modulating signals to be transmitted, or various other circuits or controllers operable for supporting described operations of the chalcogenide capacitors 105.

At 310, the controller 305 may apply, for a first duration, a first programming pulse to a chalcogenide capacitor 105-*g*, to adjust a capacitance of the chalcogenide capacitor 105-*g* from a first capacitance to a second capacitance. The first programming pulse may satisfy a first voltage threshold (e.g., the first programming pulse may have a voltage greater than the first voltage threshold). In some cases, the capacitance of the chalcogenide capacitor 105-*g* may be increased from the first capacitance to the second capacitance based on a voltage of the first programming pulse satisfying the first threshold voltage. In some cases, the first programming pulse may have a first polarity and adjusting the capacitance of the chalcogenide capacitor 105-*g* to the second capacitance may be based on the first programming pulse having the first polarity.

In some other cases, adjusting the capacitance of the chalcogenide capacitor 105-*g* to the second capacitance may not be based on the first programming pulse having the first polarity. For example, the capacitance of the chalcogenide capacitor 105-*g* may be agnostic to the polarity of the first programming pulse. In some cases, the first programming pulse may have a second polarity and adjusting the capacitance of the chalcogenide capacitor 105-*g* to the second capacitance may be based on the first programming pulse having the second polarity. In some cases, the controller 305 may apply, the first programming pulse to the chalcogenide capacitor 105-*g* and the chalcogenide capacitor 105-*h*, concurrently. Additionally or alternatively, the controller 305 may concurrently apply different programming pulses to the chalcogenide capacitor 105-*g* and the chalcogenide capacitor 105-*h* (e.g., programming pulses with different voltages, polarities, or both).

At 315, the controller 305 may store a first voltage to the chalcogenide capacitor 105-*g* based on adjusting the capacitance of the chalcogenide capacitor 105-*g* from the first capacitance to the second capacitance. The first voltage may be based on the chalcogenide capacitor 105-*g* having the second capacitance. In some cases, storing the first voltage to the chalcogenide capacitor 105-*g* may include applying a pulse (e.g., different from a programming pulse) to the chalcogenide capacitor 105-*g*. In some cases, applying the pulse to the chalcogenide capacitor 105-*g* (e.g., storing the first voltage to the chalcogenide capacitor 105-*g*) may be based on applying the first programming pulse to the chalcogenide capacitor 105-*g*. In some cases, the first voltage stored in the chalcogenide capacitor 105-*g* may be less than a first threshold voltage.

In some cases, applying one or more programming pulses to the chalcogenide capacitors 105 and storing one or more voltages to the chalcogenide capacitors 105 may be part of one or more operations for an analog-to-digital converter or any other device or system. In some other cases, applying one or more programming pulses to the chalcogenide capacitors 105 and storing one or more voltages to the chalcogenide capacitors 105 may be based on one or more parameters for an energy storage operation, a power conditioning operation, a signal processing operation, a sensing operation, a data storage operation, or for any other operation of a device or system associated with the chalcogenide capacitors 105.

In some cases, the controller 305 may store the first voltage to the chalcogenide capacitor 105-*h*, concurrently with storing the first voltage to the chalcogenide capacitor 105-*g*. In some other cases, the controller 305 may store a voltage to chalcogenide capacitor 105-*h* that is different from the first voltage. The first voltage stored in the chalcogenide capacitor 105-*h* may be based on the chalcogenide capacitor 105-*h* having the second capacitance. In some cases, storing the first voltage to the chalcogenide capacitor 105-*h* may include applying a pulse to the chalcogenide capacitor 105-*h*. In some cases, applying the pulse to the chalcogenide capacitor 105-*h* (e.g., storing the first voltage to the chalcogenide capacitor 105-*h*) may be based on applying the first programming pulse to the chalcogenide capacitor 105-*h*.

At 320, the controller 305 may apply, for a second duration, a second programming pulse to the chalcogenide capacitor 105-*g* to adjust the capacitance of the chalcogenide capacitor 105-*g* from the second capacitance to a third capacitance. The capacitance of the chalcogenide capacitor 105-*g* may be decreased from the second capacitance to the third capacitance based on a voltage of the second programming pulse satisfying a second threshold voltage. In some cases, decreasing the capacitance of the chalcogenide capacitor 105-*g* may include resetting the chalcogenide capacitor 105-*g* to an initial capacitance. In some cases, the second threshold voltage may be greater than a first threshold voltage.

In some cases, the controller 305 may apply the second programming pulse to the chalcogenide capacitor 105-*h*, concurrently with applying the second programming pulse to the chalcogenide capacitor 105-*g*. Applying the second programming pulse to the chalcogenide capacitor 105-*d* may adjust the capacitance of the chalcogenide capacitor 105-*h* from the second capacitance to a third capacitance. In some cases, the controller 305 may apply the second programming pulse to the chalcogenide capacitor 105-*h* for a second duration. In some cases, decreasing the capacitance of the chalcogenide capacitor 105-*h* may include resetting the chalcogenide capacitor 105-*h* to an initial capacitance.

At 325, the controller 305 may store a second voltage to the chalcogenide capacitor 105-*g* based on adjusting the capacitance of the chalcogenide capacitor 105-*g* from the first capacitance to the second capacitance. The second voltage may be based on the chalcogenide capacitor 105-*g* having the third capacitance. In some cases, storing the second voltage to the chalcogenide capacitor 105-*g* may include applying a pulse (e.g., different from a programming pulse) to the chalcogenide capacitor 105-*g*. In some cases, applying the pulse to the chalcogenide capacitor 105-*g* (e.g., storing the second voltage to the chalcogenide capacitor 105-*g*) may be based on applying the second programming pulse to the chalcogenide capacitor 105-*g*. In some cases, the second voltage stored in the chalcogenide capacitor 105-*g* may be less than a first threshold voltage.

In some cases, the controller 305 may store the second voltage to the chalcogenide capacitor 105-*h*, concurrently with storing the second voltage to the chalcogenide capacitor 105-*g*. In some other cases, the controller 305 may store a voltage to chalcogenide capacitor 105-*h* that is different from the second voltage. The second voltage stored in the chalcogenide capacitor 105-*h* may be based on the chalcogenide capacitor 105-*h* having the third capacitance. In some cases, storing the second voltage to the chalcogenide capacitor 105-*h* may include applying a pulse to the chalcogenide capacitor 105-*h*. In some cases, applying the pulse to the chalcogenide capacitor 105-*h* (e.g., storing the second voltage to the chalcogenide capacitor 105-*h*) may be based on applying the second programming pulse to the chalcogenide capacitor 105-*h*.

At 330, the controller 305 may apply, for a third duration, a third programming pulse to the chalcogenide capacitor 105-*g* to increase the capacitance of the chalcogenide capacitor 105-*g* from the second capacitance to a fourth capacitance. The first programming pulse and the third programming pulse may have a same polarity. In some other cases, the first programming pulse may have a first polarity and the third programming pulse may have a second polarity different from the first polarity. In some cases, the first duration and the third duration may be a same duration. In some other cases, the first duration may be a different duration than the third duration.

In some cases, the controller 305 may apply the third programming pulse to the chalcogenide capacitor 105-*h* concurrently with applying the third programming pulse to the chalcogenide capacitor 105-*g*. Applying the third programming pulse to the chalcogenide capacitor 105-*h* may increase the capacitance of the chalcogenide capacitor 105-*h* form the second capacitance to the fourth capacitance. The first programming pulse and the third programming pulse may have a same polarity. In some other cases, the first programming pulse may have a first polarity and the third programming pulse may have a second polarity different from the first polarity. In some cases, the controller 305 may apply the third programming pulse to the chalcogenide capacitor 105-*f* for a third duration. The first duration and the third duration may be a same duration. In some other cases, the first duration may be a different duration than the third duration.

At 335, the controller 305 may store a third voltage to the chalcogenide capacitor 105-*g* based on increasing the capacitance of the chalcogenide capacitor 105-*g* from the second capacitance to the fourth capacitance, wherein the third voltage is based on the chalcogenide capacitor 105-*g* having the fourth capacitance. In some cases, the controller 305 may concurrently store the third voltage to the chalcogenide capacitor 105-*g* and the chalcogenide capacitor 105-*h*. In some cases, the controller 305 may store a voltage in the chalcogenide capacitor 105-*h*, which may be different from the third voltage stored in the chalcogenide capacitor 105-*g*.

At 340, the controller 305 may apply electromagnetic radiation to the chalcogenide capacitor 105-*g*. In some cases, applying the electromagnetic radiation may decrease the capacitance of the chalcogenide capacitor 105-*g* from the second capacitance to a sixth capacitance. The sixth capacitance may be less than both the first capacitance and the second capacitance. In some cases, applying electromagnetic radiation to the chalcogenide capacitor 105-*g* may include applying UV light to the chalcogenide capacitor 105-*g*. Additionally or alternatively, the controller 305 may concurrently apply electromagnetic radio to the chalcogenide capacitor 105-*g* and the chalcogenide capacitor 105-*h*. In some cases the controller 305 may concurrently apply a same quantity of electromagnetic radiation to the chalcogenide capacitor 105-*g* and the chalcogenide capacitor 105-*h*. In some other cases, the controller 305 may concurrently apply different quantities of electromagnetic radiation to the chalcogenide capacitor 105-*g* and the chalcogenide capacitor 105-*h*.

FIG. 4 shows a flowchart illustrating a method 400 that supports programmable chalcogenide capacitors in accordance with examples as disclosed herein. The operations of method 400 may be implemented by a controller or its components as described herein. For example, the operations of method 400 may be performed by a controller as described with reference to FIG. 3. In some examples, a controller may execute a set of instructions to control the functional elements of the controller to perform the described functions. Additionally, or alternatively, the controller may perform aspects of the described functions using special-purpose hardware.

At 405, the method may include applying, for a first duration, a first programming pulse to a capacitor including a chalcogenide material (e.g., a chalcogenide capacitor 105) to adjust a capacitance of the capacitor from a first capacitance to a second capacitance. The operations of 405 may be performed in accordance with examples as disclosed herein. In some examples, aspects of the operations of 405 may be performed by a controller 305 as described with reference to FIG. 3. Additionally or alternatively, aspects of the operations of 405 may be performed by any device capable of applying one or more pulses to a chalcogenide capacitor 105, as described with reference to FIGS. 1-3.

At 410, the method may include storing a first voltage to the capacitor based at least in part on adjusting the capacitance of the capacitor from the first capacitance to the second capacitance, where the first voltage is based at least in part on the capacitor having the second capacitance. The operations of 410 may be performed in accordance with examples as disclosed herein. In some examples, aspects of the operations of 410 may be performed by a controller 305 as described with reference to FIG. 3. Additionally or alternatively, aspects of the operations of 410 may be performed by any device capable of applying one or more pulses to a chalcogenide capacitor 105, as described with reference to FIGS. 1-3.

In some examples, an apparatus as described herein may perform a method or methods, such as the method 400. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for applying, for a first duration, a first programming pulse to a capacitor including a chalcogenide material to adjust a capacitance of the capacitor from a first capacitance to a second capacitance and storing a first voltage to the capacitor based at least in part on adjusting the capacitance of the capacitor from the first capacitance to the second capacitance, where the first voltage is based at least in part on the capacitor having the second capacitance.

Aspect 2: The method, apparatus, or non-transitory computer-readable medium of aspect 1, where storing the first voltage to the capacitor includes operations, features, circuitry, logic, means, or instructions, or any combination thereof for applying a pulse to the capacitor based at least in part on applying the first programming pulse to the capacitor.

Aspect 3: The method, apparatus, or non-transitory computer-readable medium of any of aspects 1 through 2, where the capacitance of the capacitor is increased from the first capacitance to the second capacitance based at least in part on a voltage of the first programming pulse satisfying a first threshold voltage.

Aspect 4: The method, apparatus, or non-transitory computer-readable medium of any of aspects 1 through 3, further including operations, features, circuitry, logic, means, or instructions, or any combination thereof for applying, for a second duration, a second programming pulse to the capacitor to adjust the capacitance of the capacitor from the second capacitance to a third capacitance, where the capacitance of the capacitor is decreased from the second capacitance to the third capacitance based at least in part on a voltage of the second programming pulse satisfying a second threshold voltage.

Aspect 5: The method, apparatus, or non-transitory computer-readable medium of aspect 4, where applying the second programming pulse to the capacitor to decrease the capacitance from the second capacitance to the third capacitance further includes operations, features, circuitry, logic, means, or instructions, or any combination thereof for resetting the capacitor to an initial capacitance.

Aspect 6: The method, apparatus, or non-transitory computer-readable medium of any of aspects 4 through 5, where the second threshold voltage is greater than a first threshold voltage.

Aspect 7: The method, apparatus, or non-transitory computer-readable medium of any of aspects 1 through 6, further including operations, features, circuitry, logic, means, or instructions, or any combination thereof for applying, for a third duration, a third programming pulse to the capacitor to increase the capacitance of the capacitor from the second capacitance to a fourth capacitance and storing a second voltage to the capacitor based at least in part on increasing the capacitance of the capacitor from the second capacitance to the fourth capacitance, where the second voltage is based at least in part on the capacitor having the fourth capacitance.

Aspect 8: The method, apparatus, or non-transitory computer-readable medium of aspect 7, where the first programming pulse and the third programming pulse include a same polarity.

Aspect 9: The method, apparatus, or non-transitory computer-readable medium of aspect 7, where the first programming pulse includes a first polarity and the third programming pulse has a second polarity different than the first polarity.

Aspect 10: The method, apparatus, or non-transitory computer-readable medium of any of aspects 7 through 9, where the first duration and the third duration include a same duration.

Aspect 11: The method, apparatus, or non-transitory computer-readable medium of any of aspects 7 through 9, where the first duration includes a different duration than the third duration.

Aspect 12: The method, apparatus, or non-transitory computer-readable medium of any of aspects 1 through 11, where the first programming pulse has a first polarity and adjusting the capacitance of the capacitor to the second capacitance is based at least in part on the first programming pulse having the first polarity.

Aspect 13: The method, apparatus, or non-transitory computer-readable medium of any of aspects 1 through 12, where the first programming pulse has a second polarity and adjusting the capacitance of the capacitor to the second capacitance is based at least in part on the first programming pulse having the second polarity.

Aspect 14: The method, apparatus, or non-transitory computer-readable medium of any of aspects 1 through 13, further including operations, features, circuitry, logic, means, or instructions, or any combination thereof for applying, for a fourth duration, a fourth programming pulse to the capacitor to adjust the capacitance of the capacitor from the second capacitance to an initial capacitance based at least in part on a voltage of the fourth programming pulse satisfying a second threshold voltage.

Aspect 15: The method, apparatus, or non-transitory computer-readable medium of any of aspects 1 through 14, further including operations, features, circuitry, logic, means, or instructions, or any combination thereof for applying electromagnetic radiation to the capacitor and decreasing the capacitance of the capacitor from the second capacitance to a sixth capacitance based at least in part on applying the electromagnetic radiation to the capacitor, where the sixth capacitance is less than both the first capacitance and the second capacitance.

Aspect 16: The method, apparatus, or non-transitory computer-readable medium of any of aspects 1 through 15, where the first voltage stored in the capacitor is less than a first threshold voltage.

Aspect 17: The method, apparatus, or non-transitory computer-readable medium of any of aspects 1 through 16, further including operations, features, circuitry, logic, means, or instructions, or any combination thereof for applying, for a third duration that commences currently with the first duration, a fourth programming pulse to a second capacitor including a second chalcogenide material to adjust a capacitance of the second capacitor from a seventh capacitance to an eighth capacitance and storing a third voltage to the second capacitor based at least in part on increasing the capacitance of the second capacitor from the seventh capacitance to the eighth capacitance, where the third voltage is based at least in part on the capacitor having the eighth capacitance.

Aspect 18: The method, apparatus, or non-transitory computer-readable medium of aspect 17, where the first capacitance and the eighth capacitance have a same capacitance.

Aspect 19: The method, apparatus, or non-transitory computer-readable medium of any of aspects 1 through 18, where storing the first voltage to the capacitor further includes operations, features, circuitry, logic, means, or instructions, or any combination thereof for storing the first voltage to the capacitor as part of one or more operations for an analog-to-digital converter.

It should be noted that the methods described herein describe possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 20: An apparatus, including: a first access line; a second access line; a capacitor including an anode coupled with the first access line, a cathode coupled with the second access line, and a chalcogenide material; and a controller operable to cause the apparatus to: apply, for a first duration, a first programming pulse to the capacitor to adjust a capacitance of the capacitor from a first capacitance to a second capacitance; and store a first voltage to the capacitor based at least in part on adjusting the capacitance of the capacitor from the first capacitance to the second capacitance, where the first voltage is based at least in part on the capacitor having the second capacitance.

Aspect 21: The apparatus of aspect 20, where to store the first voltage to the capacitor, the controller is operable to cause the apparatus to: apply a pulse to the capacitor based at least in part on applying the first programming pulse to the capacitor.

Aspect 22: The apparatus of any of aspects 20 through 21, where the capacitance of the capacitor is increased from the first capacitance to the second capacitance based at least in part on a voltage of the first programming pulse satisfying a first threshold voltage.

Aspect 23: The apparatus of any of aspects 20 through 22, where the controller is operable to cause the apparatus to: apply, for a second duration, a second programming pulse to the capacitor to adjust the capacitance of the capacitor from the second capacitance to a third capacitance, where the capacitance of the capacitor is decreased from the second capacitance to the third capacitance based at least in part on a voltage of the second programming pulse satisfying a second threshold voltage.

Aspect 24: The apparatus of any of aspects 20 through 23, further including: a plurality of capacitors that each include a respective anode, cathode, and chalcogenide material, where each of the plurality of capacitors are coupled with the first access line and the second access line, where the controller is operable to cause the apparatus to: apply, for a third duration that commences currently with the first duration, a third programming pulse to each capacitor of the plurality of capacitors to increase a capacitance of each capacitor of the plurality of capacitors from a fourth capacitance to a fifth capacitance based at least in part on applying the third programming pulse for the third duration; and store a second voltage to each capacitor of the plurality of capacitors based at least in part on increasing the capacitance of the plurality of capacitors from the fourth capacitance to the fifth capacitance, where the second voltage is based at least in part on each of the plurality of capacitors having the fifth capacitance.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels A switching component or a transistor described herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:

applying, for a first duration, a first programming pulse to a capacitor comprising a chalcogenide material to adjust a capacitance of the capacitor from a first capacitance to a second capacitance; and storing a first voltage to the capacitor based at least in part on adjusting the capacitance of the capacitor from the first capacitance to the second capacitance, wherein the first voltage is based at least in part on the capacitor having the second capacitance.

2. The method of claim 1, wherein storing the first voltage to the capacitor comprises:

applying a pulse to the capacitor based at least in part on applying the first programming pulse to the capacitor.

3. The method of claim 1, wherein the capacitance of the capacitor is increased from the first capacitance to the second capacitance based at least in part on a voltage of the first programming pulse satisfying a first threshold voltage.

4. The method of claim 1, further comprising:

applying, for a second duration, a second programming pulse to the capacitor to adjust the capacitance of the capacitor from the second capacitance to a third capacitance, wherein the capacitance of the capacitor is decreased from the second capacitance to the third capacitance based at least in part on a voltage of the second programming pulse satisfying a second threshold voltage.

5. The method of claim 4, wherein applying the second programming pulse to the capacitor to decrease the capacitance from the second capacitance to the third capacitance further comprises:

resetting the capacitor to an initial capacitance.

6. The method of claim 4, wherein the second threshold voltage is greater than a first threshold voltage.

7. The method of claim 1, further comprising:

applying, for a third duration, a third programming pulse to the capacitor to increase the capacitance of the capacitor from the second capacitance to a fourth capacitance; and storing a second voltage to the capacitor based at least in part on increasing the capacitance of the capacitor from the second capacitance to the fourth capacitance, wherein the second voltage is based at least in part on the capacitor having the fourth capacitance.

8. The method of claim 7, wherein the first programming pulse and the third programming pulse comprise a same polarity.

9. The method of claim 7, wherein the first programming pulse comprises a first polarity and the third programming pulse has a second polarity different than the first polarity.

10. The method of claim 7, wherein the first duration and the third duration comprise a same duration.

11. The method of claim 7, wherein the first duration comprises a different duration than the third duration.

12. The method of claim 1, wherein the first programming pulse has a first polarity and adjusting the capacitance of the capacitor to the second capacitance is based at least in part on the first programming pulse having the first polarity.

13. The method of claim 1, wherein the first programming pulse has a second polarity, and adjusting the capacitance of the capacitor to the second capacitance is based at least in part on the first programming pulse having the second polarity.

14. The method of claim 1, further comprising:

applying, for a fourth duration, a fourth programming pulse to the capacitor to adjust the capacitance of the capacitor from the second capacitance to an initial capacitance based at least in part on a voltage of the fourth programming pulse satisfying a second threshold voltage.

15. The method of claim 1, further comprising:

applying electromagnetic radiation to the capacitor; and decreasing the capacitance of the capacitor from the second capacitance to a sixth capacitance based at least in part on applying the electromagnetic radiation to the capacitor, wherein the sixth capacitance is less than both the first capacitance and the second capacitance.

16. The method of claim 1, wherein the first voltage stored in the capacitor is less than a first threshold voltage.

17. The method of claim 1, further comprising:

applying, for a third duration that commences concurrently with the first duration, a fourth programming pulse to a second capacitor comprising a second chalcogenide material to adjust a capacitance of the second capacitor from a seventh capacitance to an eighth capacitance; and storing a third voltage to the second capacitor based at least in part on increasing the capacitance of the second capacitor from the seventh capacitance to the eighth capacitance, wherein the third voltage is based at least in part on the second capacitor having the eighth capacitance.

18. The method of claim 17, wherein the first capacitance and the eighth capacitance have a same capacitance.

19. The method of claim 1, wherein storing the first voltage to the capacitor further comprises:

storing the first voltage to the capacitor as part of one or more operations for an analog-to-digital converter.

20. The method of claim 1, wherein the capacitor comprises an anode and a cathode that store the first voltage.

21. The method of claim 20, wherein the chalcogenide material is between the anode and the cathode.

22. An apparatus, comprising:

a first access line;

a second access line;

a capacitor comprising an anode coupled with the first access line, a cathode coupled with the second access line, and a chalcogenide material; and a controller operable to cause the apparatus to:

apply, for a first duration, a first programming pulse to the capacitor to adjust a capacitance of the capacitor from a first capacitance to a second capacitance; and store a first voltage to the capacitor based at least in part on adjusting the capacitance of the capacitor from the first capacitance to the second capacitance, wherein the first voltage is based at least in part on the capacitor having the second capacitance.

23. The apparatus of claim 22, wherein to store the first voltage to the capacitor, the controller is operable to cause the apparatus to:

apply a pulse to the capacitor based at least in part on applying the first programming pulse to the capacitor.

24. The apparatus of claim 22, wherein the capacitance of the capacitor is increased from the first capacitance to the second capacitance based at least in part on a voltage of the first programming pulse satisfying a first threshold voltage.

25. A non-transitory computer-readable medium storing code, the code comprising instructions executable by a processor to:

apply, for a first duration, a first programming pulse to a capacitor comprising a chalcogenide material to adjust a capacitance of the capacitor from a first capacitance to a second capacitance; and store a first voltage to the capacitor based at least in part on adjusting the capacitance of the capacitor from the first capacitance to the second capacitance, wherein the first voltage is based at least in part on the capacitor having the second capacitance.

* * * * *